US005610953A

United States Patent [19]
Betts et al.

[11] Patent Number: 5,610,953
[45] Date of Patent: Mar. 11, 1997

[54] ASYNCHRONOUS LOW LATENCY DATA RECOVERY APPARATUS AND METHOD

[75] Inventors: Robert Betts, Vestal; Howard T. Olnowich, Endwell, both of N.Y.

[73] Assignee: International Business Machines Corporation, Armonk, N.Y.

[21] Appl. No.: 407,928

[22] Filed: Mar. 21, 1995

Related U.S. Application Data

[63] Continuation of Ser. No. 89,056, Jul. 8, 1993, abandoned, which is a continuation of Ser. No. 659,199, Feb. 22, 1991, abandoned.

[51] Int. Cl.$^6$ .......................................................... H04L 7/00
[52] U.S. Cl. ............................ 375/373; 375/369; 375/371; 327/144
[58] Field of Search ....................................... 375/369, 371, 375/373; 377/78–81; 371/47.1; 326/96; 327/144–145, 151, 160

[56] References Cited

U.S. PATENT DOCUMENTS

| | | | |
|---|---|---|---|
| 4,087,681 | 5/1978 | Spencer et al. | 235/466 |
| 4,169,212 | 9/1979 | Kinch, Jr. et al. | 375/368 X |
| 4,386,323 | 5/1983 | Jansen | 375/373 X |
| 4,672,639 | 6/1987 | Tanabe et al. | 375/371 |
| 4,700,347 | 10/1987 | Rettberg et al. | 375/374 X |
| 4,756,010 | 7/1988 | Nelson et al. | 375/354 |
| 4,785,469 | 11/1988 | Joshi et al. | 375/366 |
| 4,791,488 | 12/1988 | Fukazawa et al. | 375/373 X |
| 4,817,117 | 3/1989 | Tasto et al. | 375/362 |
| 4,841,551 | 6/1989 | Avaneas | 375/371 |
| 4,942,590 | 7/1990 | Terada | 375/200 |
| 4,965,884 | 10/1990 | Okura et al. | 375/372 X |
| 5,022,057 | 6/1991 | Nishi et al. | 375/373 |
| 5,046,075 | 9/1991 | Kraemer et al. | 375/373 |
| 5,185,768 | 2/1993 | Ferraiolo et al. | 375/373 |
| 5,245,637 | 9/1993 | Gersbach et al. | 375/374 |

OTHER PUBLICATIONS

Japanese Patent Application No. 59–225640.
Reference 1 (Japanese Published Unexamined Kokai) Patent Application No. 59–225640).
Japanese Patent Application No. 62–202624.
Reference 2 (Japanese Published Unexamined (Kokai) Patent Application No. 62–202624.

*Primary Examiner*—Young T. Tse
*Attorney, Agent, or Firm*—Jenkens & Gilchrist

[57] ABSTRACT

A receiver device is provided with a low latency recovery apparatus for recovering serially transmitted digital data. The receiver device operates asynchronously in respect to a transmitting device. The low latency recovery apparatus synchronizes the receiver device in one clock time to support throughput of high speed transmission messages received from interconnection networks or interface cables. A metastability proof latch is provided. A synchronization method provides individual alignment for each incoming message. There is instantaneous response to back-to-back messages from different sources. Synchronization is accomplished in the receiving device by implementing a clocking system capable of generating N phase-shifted clocks all operating at the same frequency as the incoming data. The N clocks are shifted an approximately equal amount in relation to each other. The data recovery apparatus selects the one of N clocks which is best in synchronization with the incoming serial data and then to receive the message correctly. The apparatus has a two wire interface for serial data and a bracketing control signal. Serial data is synchronized first to the selected clock and then to a local clock. The bracketing control signals when each message recovery is complete and triggers the start of another message recovery in as little as one clock time.

13 Claims, 13 Drawing Sheets

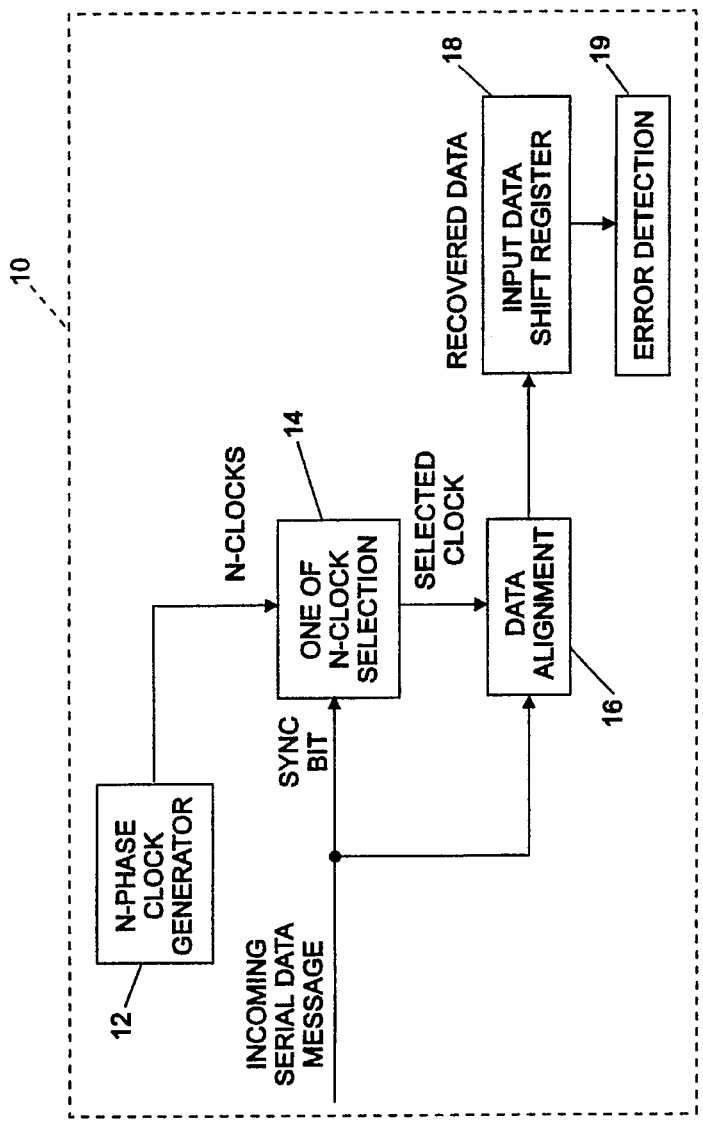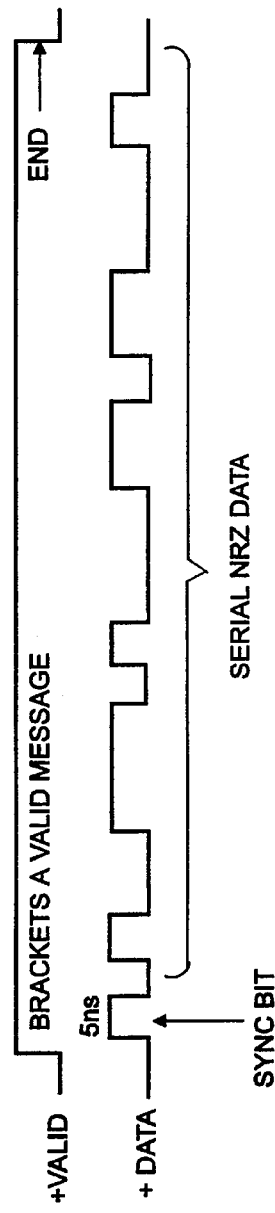

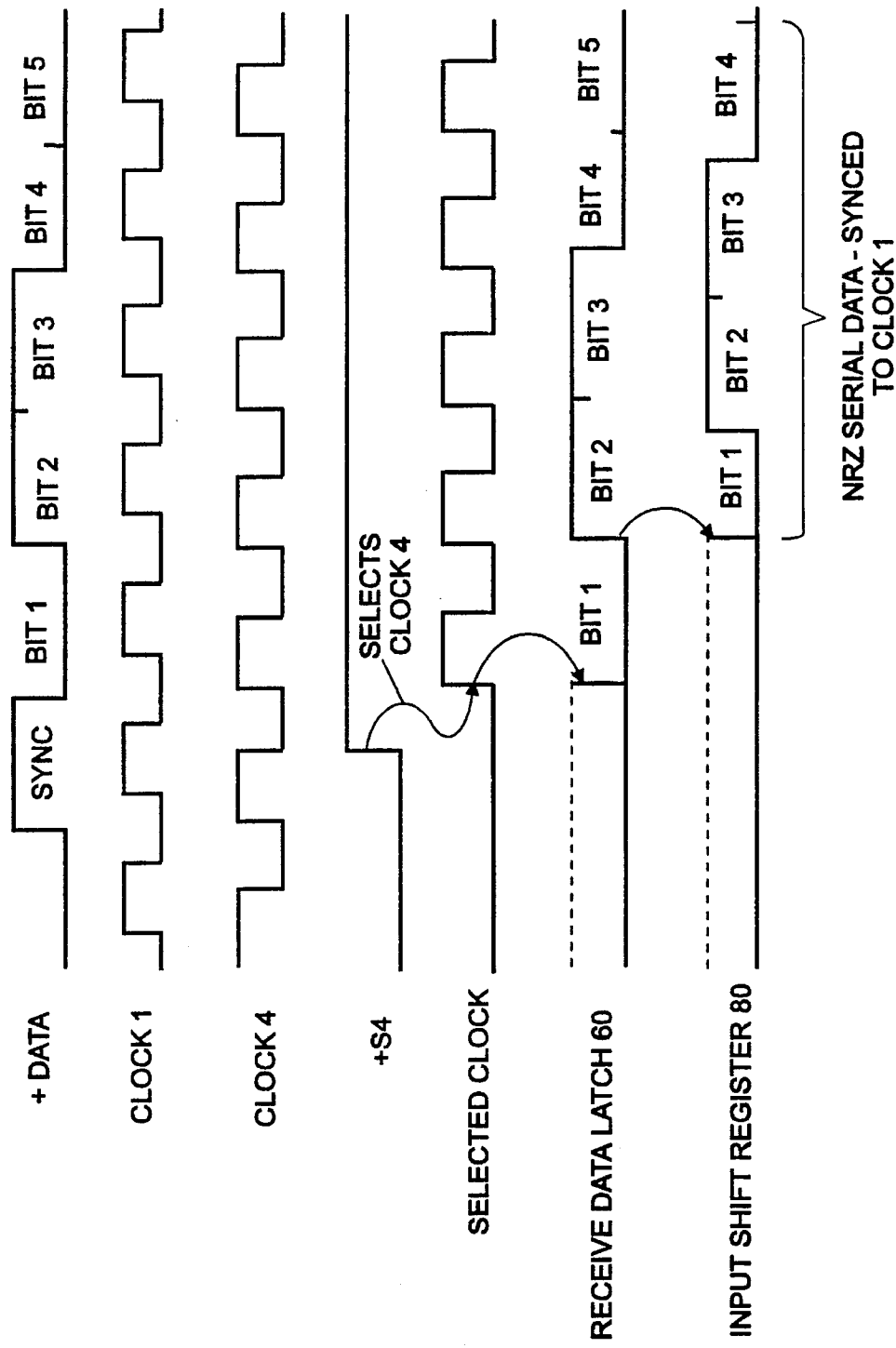

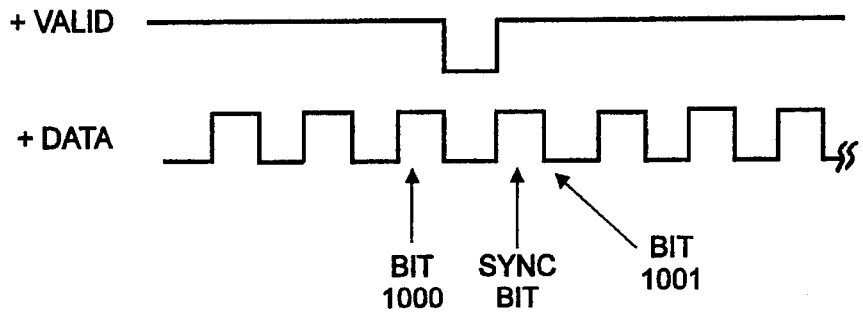
FIG. 8
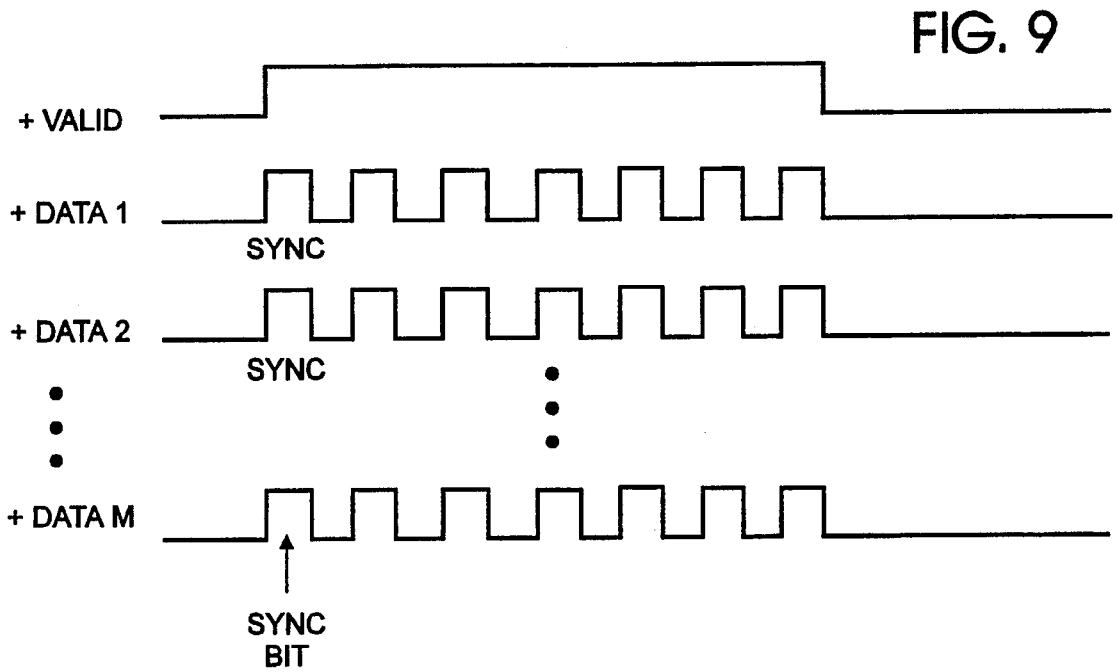
FIG. 9
FIG. 10
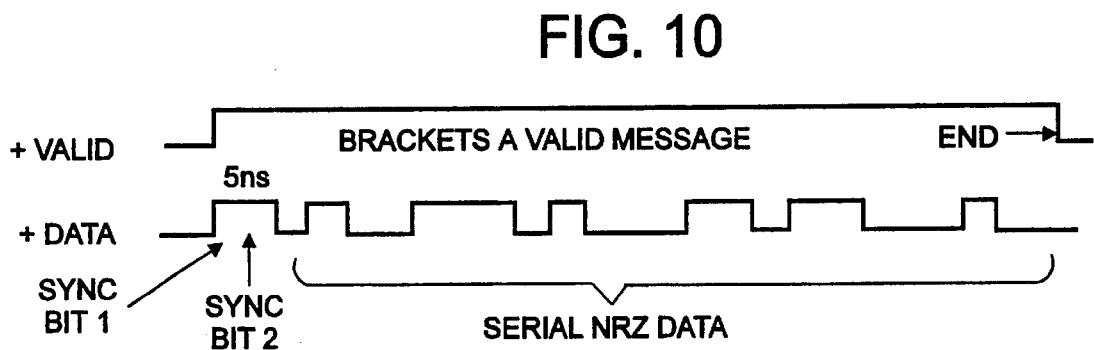

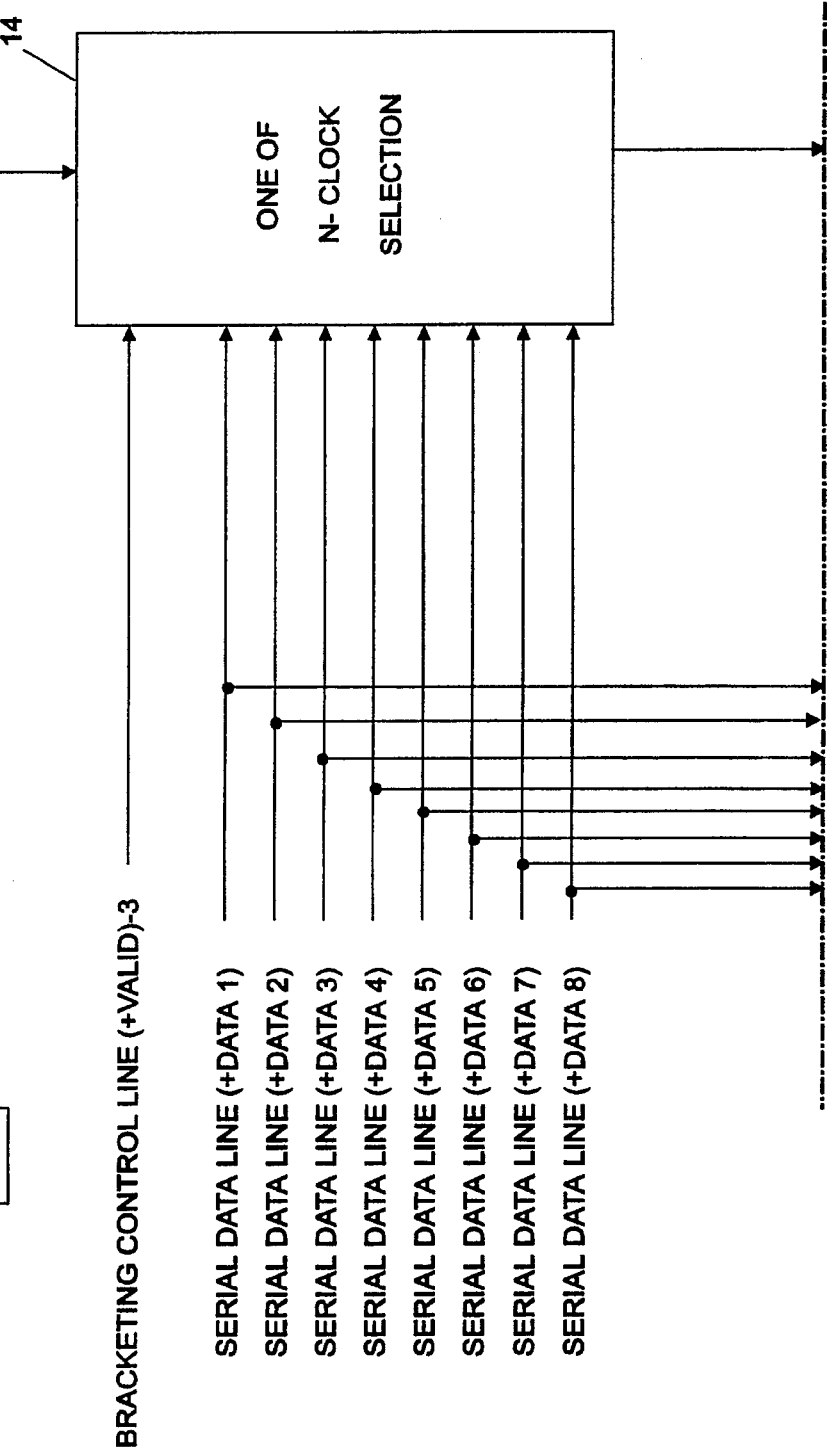

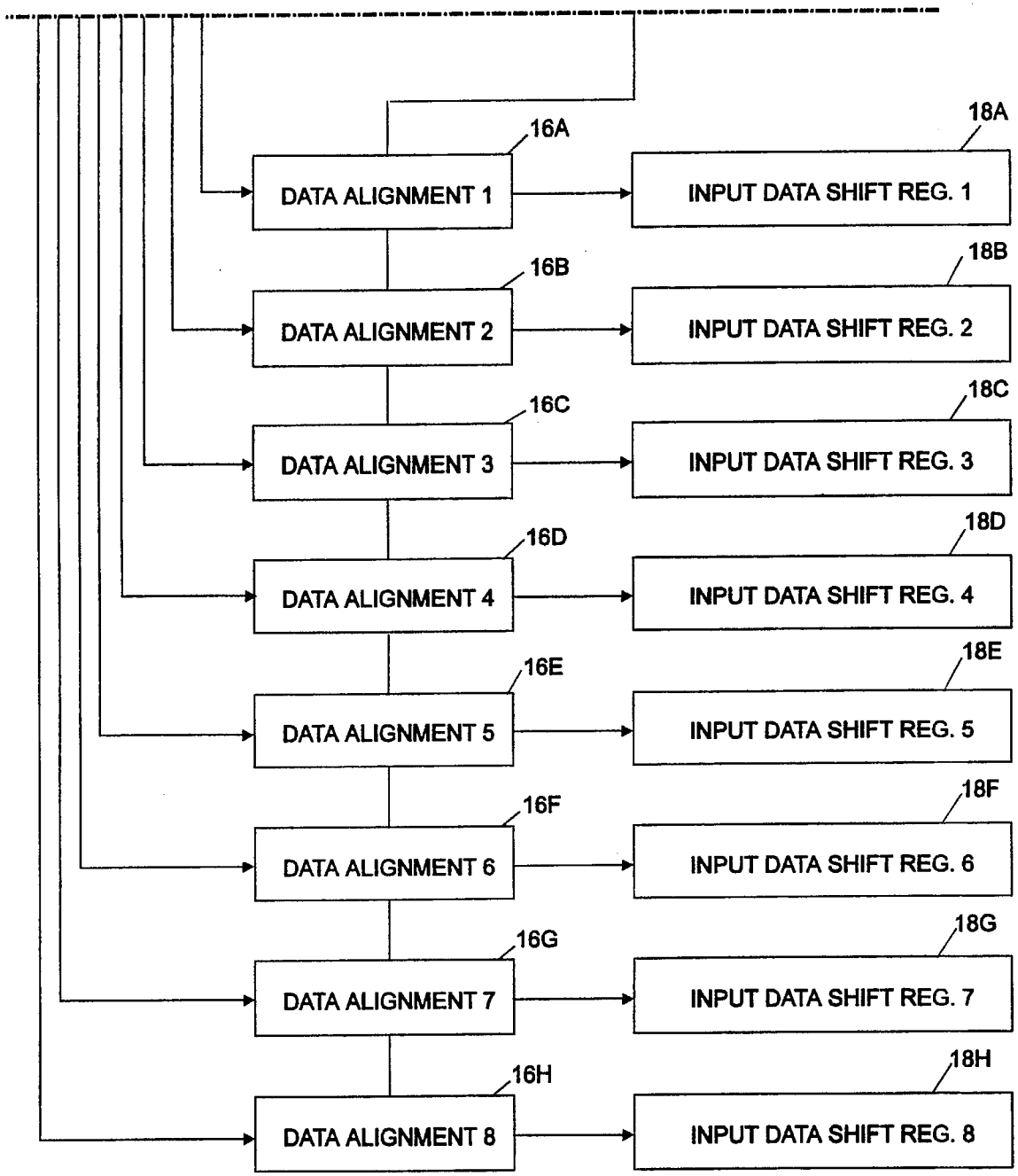
FIG. 9B2

ASYNCHRONOUS LOW LATENCY DATA RECOVERY APPARATUS AND METHOD

This application is a continuation, of application Ser. No. 08/089,056, filed Jul. 8, 1993, which is a a continuation of application Ser. No. 07/659,189, filed Feb. 22, 1991, now both abandoned.

FIELD OF THE INVENTIONS

The present invention relates to communication and digital computer input/output systems and their ability to receive asynchronously serial data and provides an apparatus and method for recovering a clock for clocking the serial data in serial data transmission.

BACKGROUND OF THE INVENTIONS

In modern digital systems, serial data are transferred between various elements of the system. It is recognized that others have done work in various systems. They have devised multi-mode digital enciphering systems which may be utilized on full duplex and half duplex communication channels as illustrated by U.S. Pat. No. 4,169,212 to Federick A. Kinch, Jr. et al, issued Sep. 25, 1985. Unlike the present application others have developed processor to peripheral interfaces for asynchronous or synchronous applications dealing with parallel data transmission, as illustrated by U.S. Pat. No. 4,785,469, to Sunil Joshi et al, issued Nov. 15, 1988. Variable rate data has been recovered by very complex methods based on patent recognition, as illustrated by U.S. Pat. No. 4,087,681 to John P. Spencer et al, issued May 2, 1978. Similarly complex is U.S. Pat. No. 4,756,010 to Leonard E. Nelson, issued Jul. 5, 1988 wherein a method of recovery was proposed that was intended to work for slower transmission rates where the receiving data contains a clock that is many time faster than the data transmission clock.

When the transmitter and receiver contain clocks which are asynchronous to each other, it becomes necessary for the receiving device to become synchronized with each incoming serial data in order to receive the data correctly. To accomplish this, the receiving device must generate a clock in synchronization with the incoming data and in turn use that clock to receive the data.

As will be seen from what we have developed, for very high transmission rates it is not desirable to have a clock which is many times faster than the transmission rate, and there is similarly needed a system which works for a fixed data rate without any need for pattern recognition. The present application relates to serial data transmission and recovers a clock for clocking the serial data. In this case, others have selected from an N phase-shifted clock that is in sync with incoming data for determining a bit clock in a data receiver from a first bit sequence of alternating half-bits received from a data transmitter after generating a local clock signal and generating a plurality of phase shifted local clock signals of equal frequency from the local clock signal, see U.S. Pat. No. 4,817,117 to Manfred Tasto et al. issued Mar. 28, 1989. This proposal did not become widely used and required generating a bit clock signal from at least one of the phase shifted local clock output signals during a predetermined minimum time interval. The system was intended to be applicable to cordless telephone sets, and required strings of bits to be generated (about 16 bits per string) to synchronize and recognize a pattern. It had need for complex hardware to do the job required.

A widely used serial data recovery scheme is based on phase-locked loop (PLL) oscillators, which entails sending serial data as a message with preamble which allows the PLL to get synchronized to the incoming serial data. In addition, the data message is encoded into special codes, such as 8 BIT/10 BIT codes, which guarantee incoming data transitions every several bits; this is used to continuously calibrate the PLL for the duration of the message, so that it remains in synchronization with the incoming data. These methods have been proven to work very well, especially for long messages. Long messages permit the overhead associated with the preamble and PLL continuous calibration to be amortized over a long period of time, such that its effect becomes negligible or small.

However, with the advent of parallel processing there has arisen a need for lower latency serial data recovery methods capable of handling short messages efficiently with a very small overhead. The conventional methods will NOT work for low-latency requirements, because the time required to synchronize a PLL oscillator via the preamble is much longer than the time to transmit a small amount of data. Such an approach would be very detrimental to performance.

In addition, there is a need in systems utilizing interconnection networks and many different clock sources to change synchronization quickly. For instance, the recovery method must synchronize quickly to receive a first message, then must be capable of resynchronizing very quickly to a different asynchronous source in order to receive a second message immediately.

Whenever data is recovered asynchronously, the possibility of circuit instability, referred to as metastability, exists and must be taken into account, as we have done with the present apparatus.

In summary, for future applications we have recognized a need for a faster and cheaper, more flexible and less complex approach to serial fixed data rate transmissions of very high rates.

SUMMARY OF THE INVENTIONS

The inventions herein relate to an apparatus for enabling a receiving device to get in synchronization with an incoming serial data message. It requires only one synchronization bit be added to the beginning of the message, instead of a long preamble—the synchronization bit is transmitted first and is always a logical 1. The hardware required with the system disclosed is a simple set and recovers a clock for the clocking of the serial data with the one synchronization bit which is first transmitted. The apparatus will prove useful in future bus applications for distributed systems, and in other applications.

Synchronization is accomplished in the receiving device by implementing a clocking system capable of generating N phase-shifted clocks all operating at the same frequency as the incoming data. The N clocks are shifted an approximately equal amount in relation to each other. Since the N clocks cover the full range of clocking possibilities, at least one of the N clocks will be in synchronization with the incoming data. The purpose of the invention apparatus is to select the one of N clocks which is best in synchronization with the incoming serial data and then to receive the message correctly. The clock selection decision is uniquely made for each and every incoming message. The selection of the one of N clocks is made entirely during the time when the synchronization bit is arriving at the receiving device. The solution is to sample the incoming synchronization bit and quickly choose the one of N clocks which is best in synchronization with the incoming data and use it to receive the following message.

We recognize that there is a limitation to our preferred approach. Both the sending and receiving devices must communicate at the same frequency; i.e., they must generate and receive messages based on oscillators that attempt to produce the same exact frequency. However, such oscillators will not be perfectly matched and there will be a small parts per million error between the frequency generated by the two oscillators. Because of this error, it is NOT possible for incoming data to remain in synchronization indefinitely with the selected clock. Synchronization will eventually be lost over time if the message is too long, because of the inaccuracy between the two oscillators. With the accuracy of oscillators today, it is estimated that the maximum allowable frequency error produced between different oscillators could cause a loss of synchronization in approximately 1000 clock times. This means if the short messages received by this approach are kept under 1000 data bits in length, there will be no loss of synchronization for the duration of the message.

BRIEF DESCRIPTION OF THE DRAWINGS

The inventions will be described now in greater detail with reference to the separate sheets of numbered appended drawings in which:

FIG. 1 shows a schematic diagram of the data recovery system for use at each receiving unit according to the present invention.

FIG. 2 shows the typical timing waveforms for incoming serial message prefixed by one synchronization bit.

FIG. 5 also shows how the selected clock is used to align the incoming data with a fixed receiving clock.

FIG. 6 shows typical timing waveforms for synchronization and reception of an incoming message.

FIG. 8 shows typical timing waveforms for re-synchronizing data messages that are too long to maintain the original synchronization selection.

FIG. 9 shows typical timing waveforms for multiple serial line transfers sharing a common +VALID signal.

FIG. 9A shows the input from a transmitting device to the recovery apparatus located in a receiving device; while FIG. 9B shows an overall diagram of the recovery logic for plural lines.

FIG. 10 shows typical timing waveforms for data transfers prefixed by two synchronization bits.

DETAILED DESCRIPTION OF THE PREFERRED EMBODIMENTS

Figure 1A:
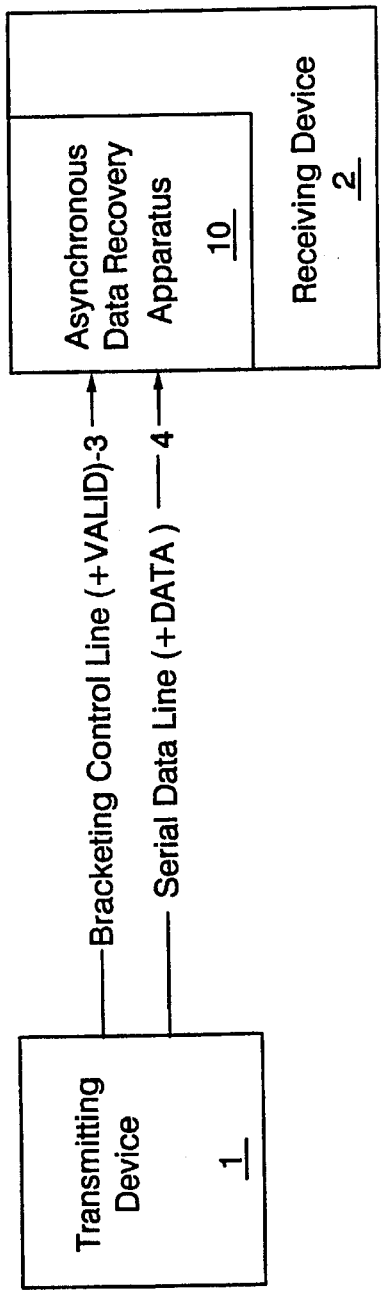
FIG. 1A shows a schematic diagram of a transmitting device sending serial data to a receiving device using asynchronous means where no clock signal is transmitted or shared in common between the transmitting device and the receiving device.

Referring to FIG. 1A, the locality of the disclosed asynchronous data recovery apparatus 10 (as shown in FIG. 1) is shown in relationship to the overall communication process. Apparatus 10 comprises part of a receiving device 2, said part being used to receive serial data over line 4 under the control of bracketing control signal 3. The signals 3 and 4 connecting the transmitting device 1 to the receiving device 2 are used to send serial data from transmitting device 1 to receiving device 2. The transmitting device 1 and the receiving device 2 can be any electronic equipment or computer input/output devices having a requirement for the transmittal of data from the transmitting device to the receiving device. The present invention resides at the receiving device only and serves as a means of synchronizing and recovering the asynchronous data sent over line 4 from transmitting device 1 to receiving device 2. The bracketing control signal 3 is transmitted simultaneously with data on line 4 and aids in the process of recovering the asynchronous data.

The preferred embodiment is for N=4, where "N" phase-shifted clocks are generated by the receiving device. As each incoming message appears at the receiving device, one of the 4 clocks is chosen to best receive that particular message. "N" may be changed. It should be recognized that the preferred embodiment of four N can assume any value greater than 2 and is not confined to 4 clocks.

We have noted that whenever data is recovered asynchronously, the possibility of circuit instability, referred to as metastability, exists and must be taken into account. The form of metastability protection recommended here in implementing our preferred embodiment is the now published Metastability Proof latch described in IBM Technical Disclosure Bulletin Vol. 32, No. 10A March 1990, Metastability Proof Latch by D. C. Banker, J. A. Dorler, G. A. Maley and H. T. Olnowich, which is incorporated herein by reference and shown in FIG. 7.

Referring to FIG. 1, serial data recovery system 10 includes circuit 12, the N-Phase clock generator; circuit 14, the one of N-Clock selection circuitry; circuit 16, the incoming data alignment circuitry; circuit 18, the input data shift register used to receive the incoming data portion of the message; and optionally circuit 19, message error detection circuitry.

Referring to FIG. 2, the timing is shown for the digital logic patterns transferred across signals 3 and 4, respectively. Signal 3, the bracketing control signal, is named +VALID for short, and the single serial data signal 4 is named +DATA. The said +VALID and +DATA signals comprise the preferred embodiment of the two-signal interface between transmitting device 1 and receiving device 2 as shown in FIG. 1A. The +DATA transmits messages comprised of two different functional patterns: the first being a synchronization bit (SYNC BIT) and the second being SERIAL NON-RETURN TO ZERO (NRZ) DATA. The SYNC BIT is always a logical 1 for exactly one clock time (5 ns); i.e., one clock time as transmitted by the transmitting device 1 which generates the +DATA signal at a 200 MHZ rate (a new bit of data every 5 ns). On the very next clock the +DATA signal contains the first bit of SERIAL NRZ DATA, and continues to contain different SERIAL NRZ DATA for every subsequent clock as long as transmitting device 1 has data to transmit. The SERIAL NRZ DATA is serially transmitted data that assumes a different bit transmittal at every clock of the transmitting device 1, and at no time is the serial data forced to go to a logical zero between consecutive bits of data. +VALID is a signal that brackets the message transmission and can optionally be used to detect the end of a message.

Figure 3:
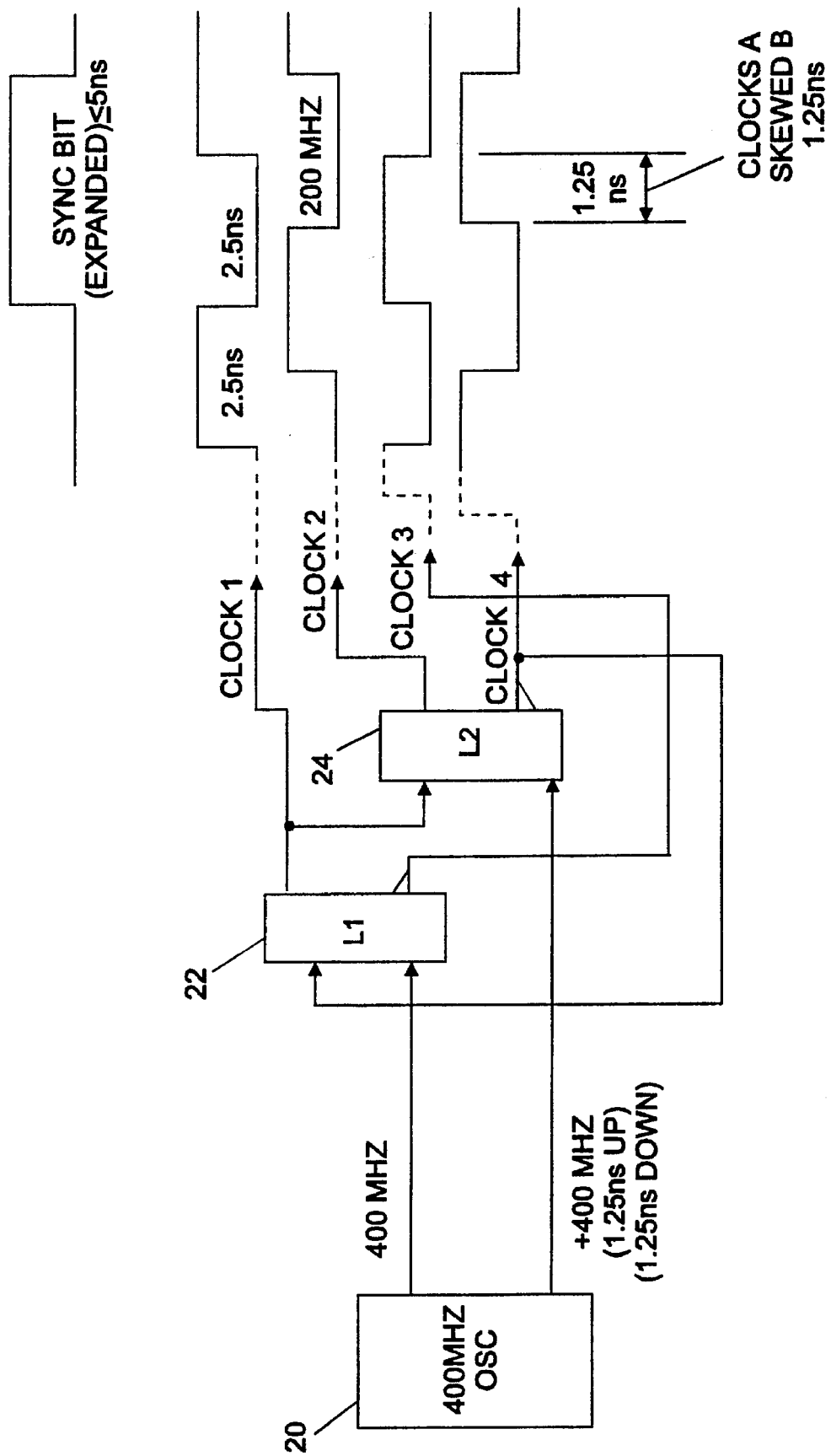
FIG. 3 shows a simple implementation for generating 4 approximately equal phase shifted clocks for the N=4 case.
Figure 4:
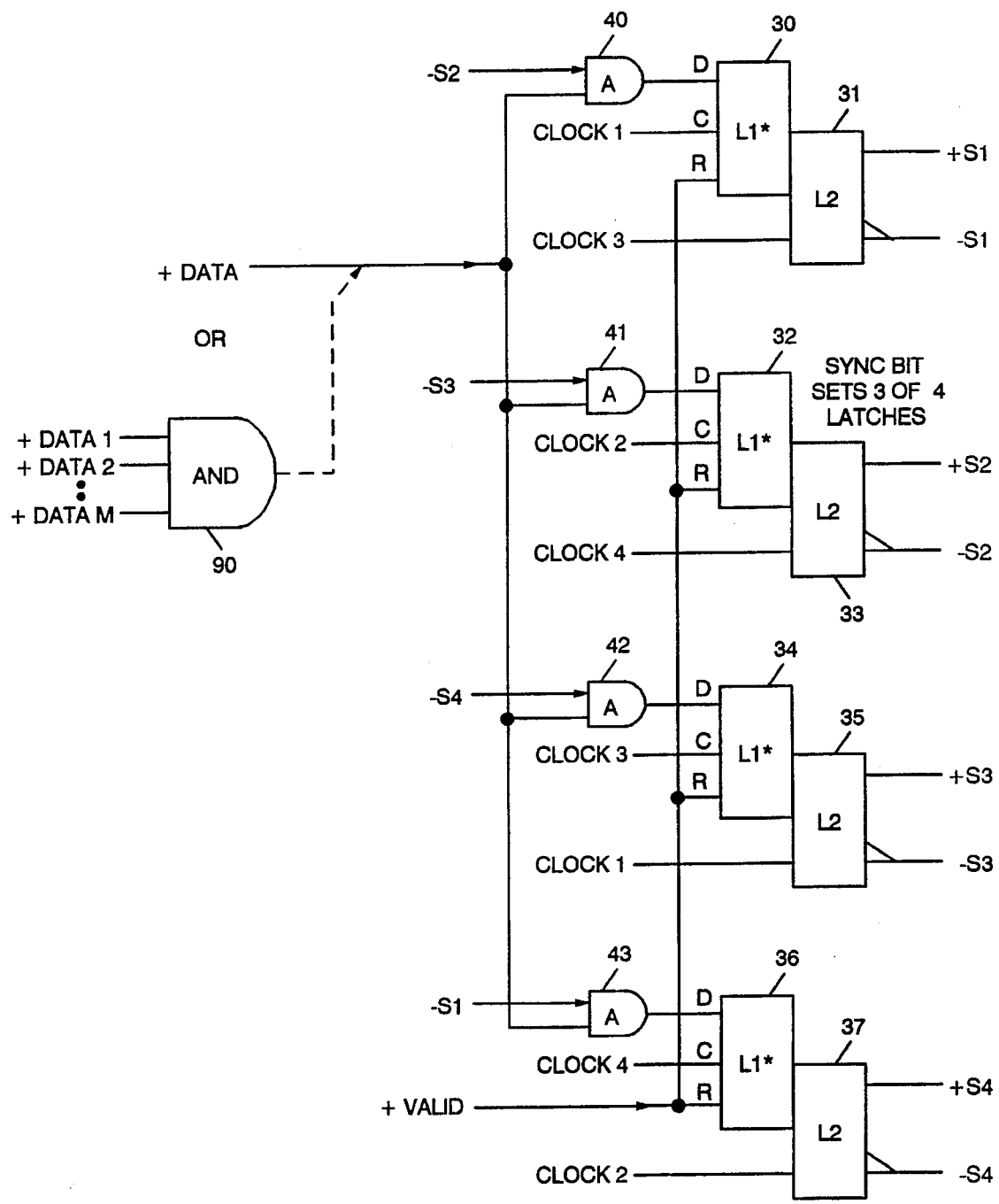
FIG. 4 shows a set of latches (1 latch for each of N phase-shifted clocks) for the purpose of receiving the one synchronization bit only.
Figure 5:
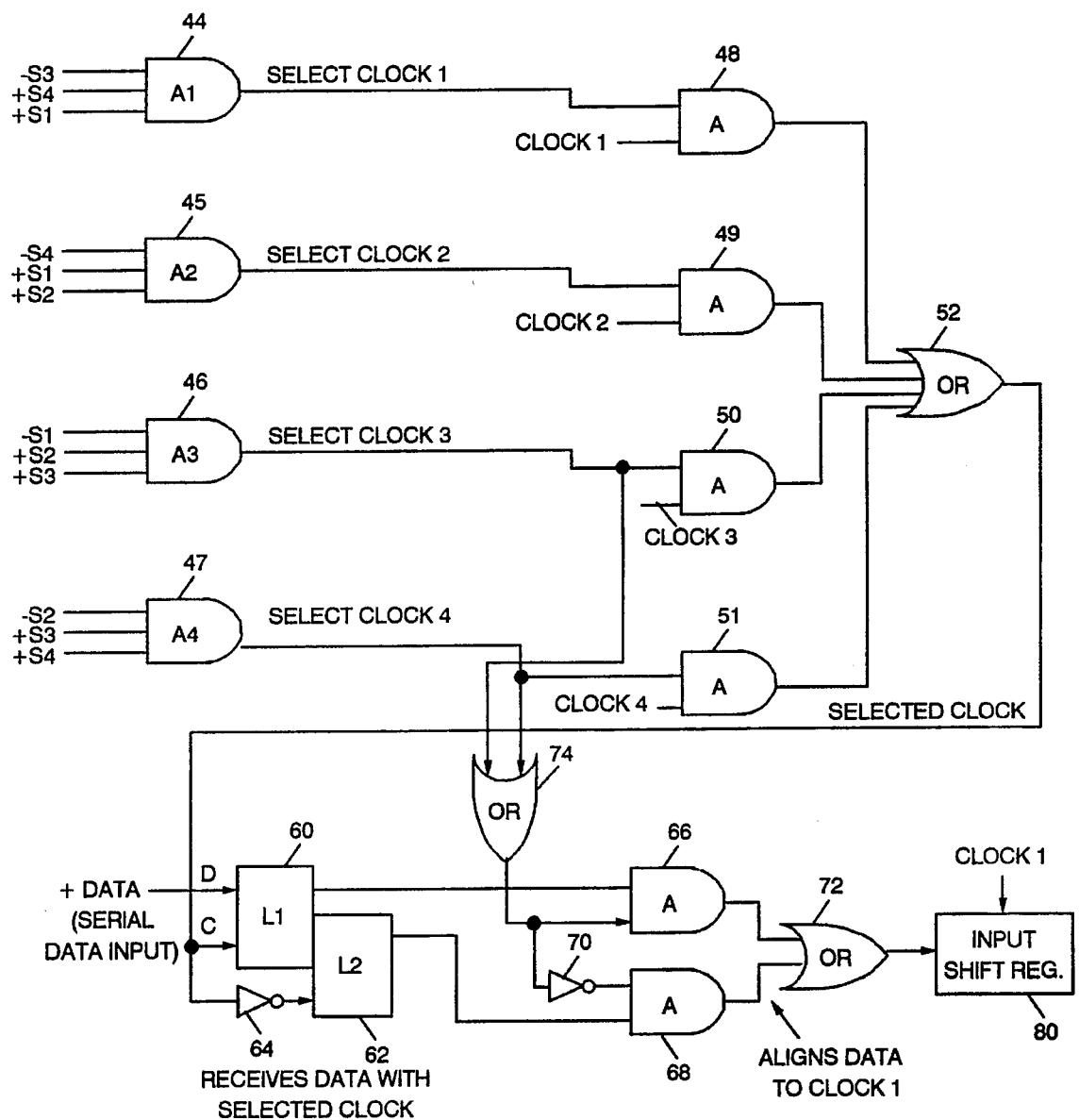
FIG. 5 shows the method of choosing one of N clocks based on the state of the N latches in FIG. 3.

Referring to FIGS. 1 and 3, circuit 12 includes oscillator 20, L1-latch 22, and L2-latch 24. The goal of the present invention is to accurately allow the receiving device 10 to get in synchronization with the serial data being sent from transmitting device 1 in 1 clock time. To accomplish this, circuit 12 generates four phase-shifted clocks. It generates the four phase-shifted 200 MHZ clocks based on a frequency of 400 MHZ and its inverse as provided by oscillator 20, which outputs square waves that are alternately up for 1.25 ns and then down for 1.25 ns. It uses a simple 2 stage shift register implemented by latches 22 and 24 which requires feedback and clocking at 400 MHZ to generate the four clocks. Notice that clock 1 and 3 are inverses, as well as 2 and 4. The timing diagram in FIG. 3 shows the waveforms of the four 200 MHZ clocks and how each is skewed 1.25 ns in relation to the others.

Referring to FIGS. 1, 4, 5 and 7, circuit 14 includes latches 30 to 37, AND gates 40 to 51 and OR gate 52. The object of circuit 14 is to choose one of the four clocks generated by circuit 12 based on the incoming sync bit. The sync bit arrives first as a logical 1 prefix to each incoming serial data message, and is sampled by four latches (30,32, 34, and 36), each being clocked by different one of the four clocks generated by circuit 12. Note that one of these four latches might encounter a metastable condition, since the data and clocks are not aligned, they could be changing simultaneously and cause an ordinary latch to be metastable (go to an indeterminate level or oscillatory condition). Thus, the present invention is aided if latches 30 to 37 are metastable proof latches and implemented as double latches, since double latching is widely recognized method for reducing metastability without the use of the preferred latch. The preferred latches 30–37 are preferred to be like the latch shown by FIG. 7.

One of the four L1-latches (30,32,34, or 36) will be set by the sync bit earlier than the others, since the clocks are staggered. For instance, in the timing diagram of FIG. 3, one random occurrence of a typical sync bit is shown in relation to the four clocks. In this example, the sync bit first rises after clock 1 has gone to a 0—so clock 1 initially misses the sync bit and latch 30 which is clocked by clock 1 does not set first. However, there is overlap between clock 2 and the sync bit, so clock 2 has coincidence with the sync bit causing latch 32 to be the first latch to set. Then 1.25 ns later latch 34 sets second and 1.25 ns later, 36 sets third. A feedback from the first latch set, 32 in the example, to the previous latch 30, prevents the setting of latch 30.

Thus 3 latches of 4 are allowed to set when the sync bit is detected. The four latches are frozen in this initial state by feedback loops internal to the L1-latch; the only thing that will cause them to change state is the +VALID signal going to a 0 at the end of the message. +VALID going to a 0 will reset all four latches and leave them ready to process the sync bit for a subsequent message.

To consistently select a clock that is the closest to the center of the sync bit, the clock that sets the second of the 3 latches is chosen as the clock to be used to recover the incoming data message. In the example, latch 34 is set second by clock 3—so clock 3 is the clock chosen. The clock selection circuitry 14 is implemented by simple combinational logic using four AND gates (44,45,46,47). For any particular selection, 3 of these AND gates will output zeroes and only 1 will be a logical 1. The selection is made based on the 4 double latches 30 to 37. In the example, the S2 output of double latch 32 and 33, the S3 output of double latch 34 and 35, and the S4 output of double latch 36 and 37 are all equal to logical ones; while the S1 output of double latch 30 and 31 is equal to logical 0 (its inverse –S1 is equal to a logical 1). The latches 30 to 37 provide logical inputs to AND gates 44 to 47 which activates AND gate 46 to a logical 1 and gates 44, 45, and 47 to zeroes. The result is that clock 3 gets selected through AND gate 50 and OR gate 52 of circuit 14 to provide the selected clock to L1-latch 60 for the purpose of clocking the incoming data message.

The final steps of the recovery operation are to align the incoming data in circuit 16 with the selected clock, store the incoming data in circuit 18, and check it for errors using circuit 19. Circuit 16 is composed of latches 60 and 62. L1-latch 60 stores each incoming data bit for one clock time and aligns the data with the selected clock. L2-latch 62 delays the serial waveform produced by L1-latch 60 by 250 ns by clocking the output of latch 60 with the inverse of the selected clock as generated by inverter 64.

Circuit 18 is composed of AND gates 66 and 68, inverter 70, OR gate 72 and input shift register 80. Circuit 18 causes the entire message to be shifted into register 80 and held there for processing by the receiving device. The receiving device usually operates on 1 local clock, called the receiving device master clock, that cannot be changed at random to follow whichever 1 of 4 clocks is selected by each incoming message. In the example, it is assumed that the receiving device uses clock 1 as its local clock. Therefore, register 80 is always clocked by clock 1 from FIG. 3.

To align the input data to register 80 for clocking by clock 1 an input data selection is made in AND gates 66 and 68. The input data selection is made from either latch 60 or latch 62 based on whether clocks 3 or 4 are selected as determined by OR gate 74 and inverter 70. If either clock 3 or 4 is selected, AND gate 66 and OR gate 72 cause the output of latch 60 to be selected to be sent to register 80 for reception by clock 1. If either clock 1 or 2 is selected, AND gate 68 and OR gate 72 cause the output of latch 62 to be selected to be sent to register 80 for reception by clock 1. FIG. 6 shows the example timing for this operation.

Figure 6A:
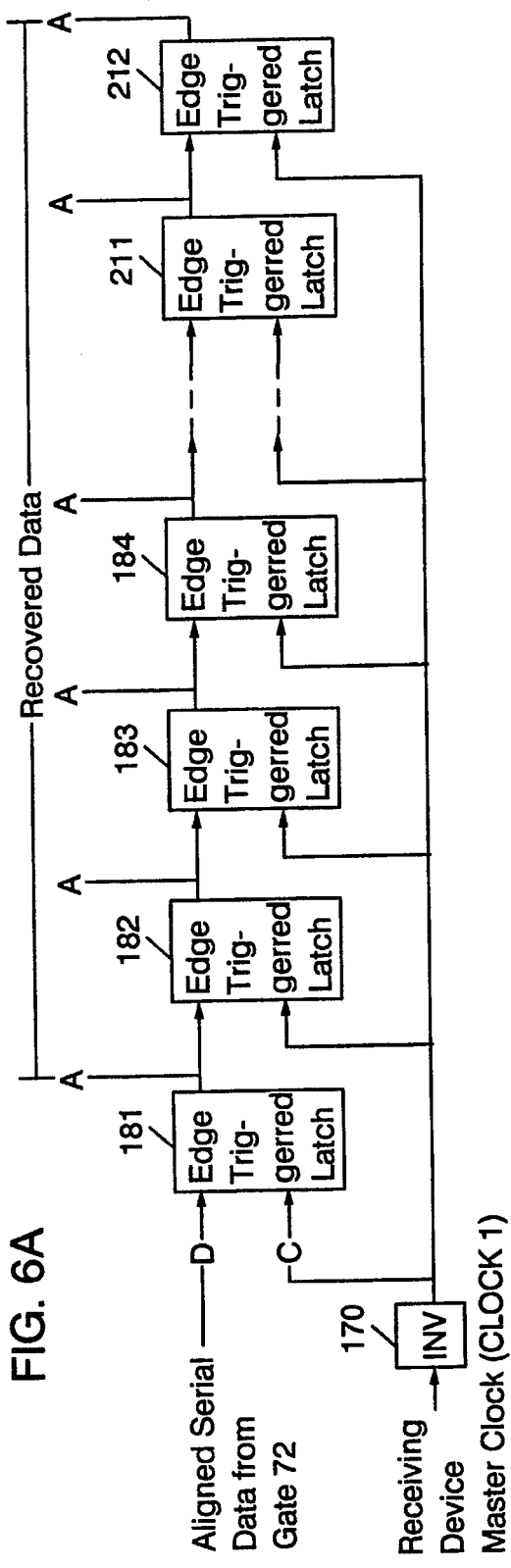
FIG. 6A shows a detailed diagram of the implementation of the input shift register circuit.

Referring to FIG. 6A, a detailed block diagram of input shift register circuit 80 (FIG. 5) is shown. FIG. 6 shows a timing diagram of the input shift register circuit 80 operation. Input shift register circuit 80 is comprised of 32 individual edge triggered latches 181 to 212, all clocked at the same time by the inverse (generated by gate 170) of the Receiving Device Master Clock (CLOCK1). The preferred embodiment is 32 latches; however, the present invention does not exclude other numbers. The data input D to latch 181 receives serial data from gate 72 of FIG. 5; while each successive latch from 182 to 212 receives data to its data input D from the previous latch in normal shift register fashion. FIG. 6 shows a timing example of how data is recovered from interface signal +DATA and shifted into input shift register circuit 80. The phase of the +DATA signal in the example is such that the +S4 latch 37 and +S3 latch 35 (FIG. 4) set and cause CLOCK 4 to be selected as the selected clock through gates 47, 51 and 52 of FIG. 5. The selected clock is used to clock buffered serial data latch 60 and the inverse of the selected clock is used to clock buffered serial data latch 62. Select clock 4 signal from gate 47 is a logical 1 in the example and causes OR gate 74 to go to a 1 also, which causes buffered serial data from latch 60 to be sent to input shift register circuit 80 through gates 66 and 72. The data input to input shift register circuit 80 in this example has the timing and waveform shown by the "RECEIVE DATA LATCH 60" signal of FIG. 6; i.e., a new bit of serial data is stored into latch 60 every time the selected clock signal 52 rises. The purpose of input shift register circuit 80 is to synchronize the serial data (+DATA) to the Receiving Device Master Clock (CLOCK1). This is accomplished by shifting a new bit of serial data into input shift register circuit 80 every time the CLOCK1 signal falls; this occurs as the CLOCK1 signal is inverted through block 170 and drives every input shift register latch 181 to 212. At the first fall of the CLOCK1 signal, BIT1 of the serial data is stored into latch 181. At the second fall of the CLOCK1 signal, BIT2 of the serial data is stored into latch 181, and BIT1 is moved simultaneously to latch 182. At the third fall of the CLOCK1 signal, BIT3 of the serial data is stored into latch 181. The shifting in of recovered and synchronized data to input shift register circuit 80 proceeds until 32 different bits (in the example) have been shifted into input shift register circuit 80 and a 32-bit recovered data word is stored in latches 181 to 212 and is available in parallel (32-bits at a time) for the receiving device 2 to use as synchronized data, which is the object of the invention.

Figure 7:
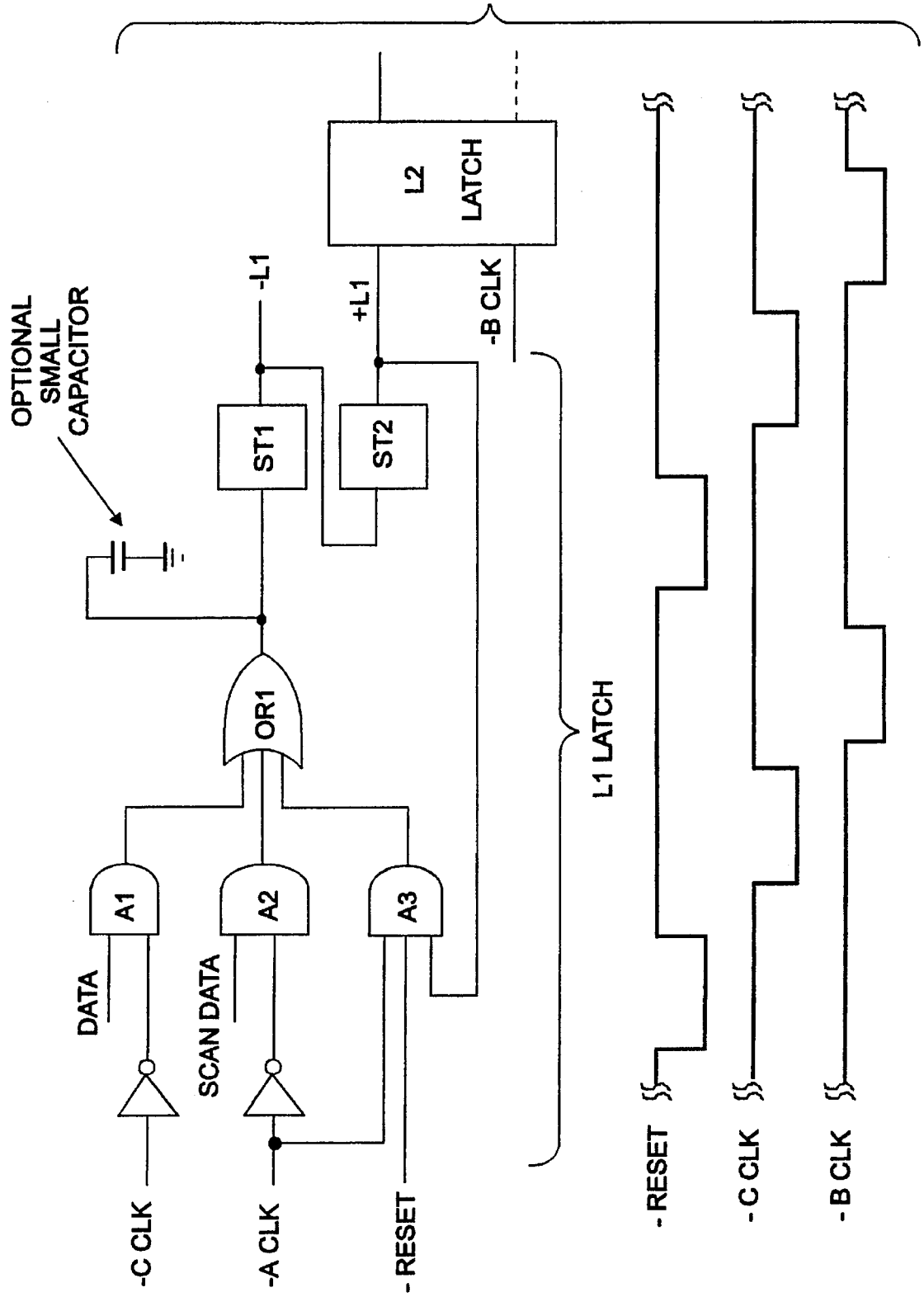
FIG. 7 shows the metastability proof latch which is preferred for use in the data recovery apparatus, together with the preferred timing.

The preferred embodiment uses the metastability proof latch shown in FIG. 7. FIG. 7 shows a circuit configuration which combats the susceptibility of digital latches to metastable conditions. In asynchronous systems, there are certain instances when noise spikes or glitches are generated due to two signals changing at approximately the same time. Such glitches can be large enough to insert a small packet of energy into a latch and cause it to become metastable. The metastability manifests itself in either of two ways; if either causes the latch to go into oscillation due to its feedback loop or causes the latch output to produce an indeterminate voltage level. In either case once started the metastable condition exists for an indeterminate length of time before it settles out and usually causes erratic hardware failures.

Some simplifying assumptions are used to reduce the scope of the problem and the first is that it does not matter whether glitches set the latch or leave it undisturbed, just as long as the latch does not go metastable. In most cases either stable result is acceptable and can be dealt with logically in a predefined manner. The next assumption is that the two signals which can cause metastability (usually data and clock) are logically ANDed together such that glitches can only occur when both signals are logical ones simultaneously. Finally, the "AND" of the two signals is used only to set the latch. Once set, the latch will be reset through an entirely separate path based on a reset signal (–RESET), whose timing is shown in FIG. 7.

Key to metastability solution is the standard digital logic circuit called the Schmitt trigger (ST) in FIG. 7. The FIG. 7 shows the preferred interconnection between two Schmitt triggers, OR gate 1 (OR1), and three AND gates (A1, A2, and A3) to form a level sensitive scan design (LSSD) dual latch composed of L1 and L2 latch stages. The ST varies slightly from the standard inverter element in that it has two unique thresholds: an upper and a lower. A signal being input, the ST must rise above the upper threshold to cause the output of the ST to change state (go to a down level). A signal with a falling input must drop below the lower threshold to cause the output of the ST to change state (go to an up level). Since there is a difference between upper and lower levels, a Schmitt trigger tends to be a pulse stretcher, and it is used as such in this disclosure to amplify a detected glitch in a defined signal.

Glitches can be caused at gate A1 by the CLOCK and DATA inputs changing asynchronously at about the same time, i.e., the data changing from "1" to "0" as –C CLK changes from "0" to "1". If the CLOCK changes slightly prior to the DATA, for a short time the output of A1 will go to a "1" (glitch) or attempt to go to a "1" and then return to its normal state of "0". The size of the glitch will depend upon the circuit speed and the length of time the changing signals are logical ones simultaneously.

An unacceptable result is for the glitch to cause a metastable condition at the LSSD latch outputs (either at the L1 or L2 stage), and this must be eliminated in several cases as follows:

The first case is one where the glitch can be too small to be propagated through gates A1 or OR1, thus causing no problem. However, if it does get through OR1, the glitch is input to ST1 and leads to the second case.

The second case is thus one where the glitch is not large enough to cross the upper threshold of ST1 and causes no problem. However, if it does cross the upper threshold of ST1, ST1 stretches or increases the pulse size. If necessary, the output from ST1 can be stretched even more by adding a small capacitor at the input to ST1 as shown. To guarantee non-metastable operation, the pulse must be stretched enough to allow the feedback loop to be closed (ST1 changing to "0" will cause ST2 to change to "1" and then feedback through A3 or OR1 to solidly force the input to ST1 to remain at a logical 1).

The third case is a variation of the second. If the input to ST1 rises to just below the upper threshold level but never crosses it, the output of ST1 could oscillate about it's upper output level. That is why ST2 is required, because such an oscillation would not cross the lower threshold of ST2 and would be squelched by ST2.

The fourth case occurs if the glitch fall time is faster than the internal ST time required to change thresholds, thus causing multiple threshold crossovers. This can be circumvented if the ST circuit designer is careful to design the ST to change thresholds quicker than the circuit providing the input can fall. A small capacitor on the input to the ST could help to slow down the input fall time as illustrated in FIG. 7.

OTHER EMBODIMENTS

Other embodiments are possible with the preferred embodiment being shown by FIGS. 1–6. These alternative embodiments may be implemented with use of the principles described with respect to the preferred embodiment. For example, the recovery apparatus can be applied to longer messages and still be much more efficient than existing 8B/10B methods. Referring to FIG. 8 it is possible to resync the serial data at any time by dropping the +VALID line for 5 ns of dead time and then raising it again and prefixing the next data with a sync bit again. The recovery logic will think that this is a new transmission and re-synchronize. The example of FIG. 8 shows a break in a long transmission after 1000 bits of serial data have been transferred and before the subsequent bits (1001 and greater) are transferred. The break and resynchronization is caused by the +VALID signal going inactive. This causes latches 30 to 37 of FIG. 4 to reset when +VALID goes to 0, and then to resynchronize when +VALID returns to a logical 1; thus, removing the reset from latches 30 to 37 and allowing them to become active again. The resynchronization example of FIG. 8 shows the pinpoint control provided by the bracketing control signal (+VALID) that permits resynchronization in one clock time (5 ns in the example. Likewise, the pin-point control of the +VALID signal can be used to transfer two different messages, where the first 1000 bits in the example are from a first message, resynchronization occurs, and the bits starting at 1001 are from a second message.

Figure 9A:
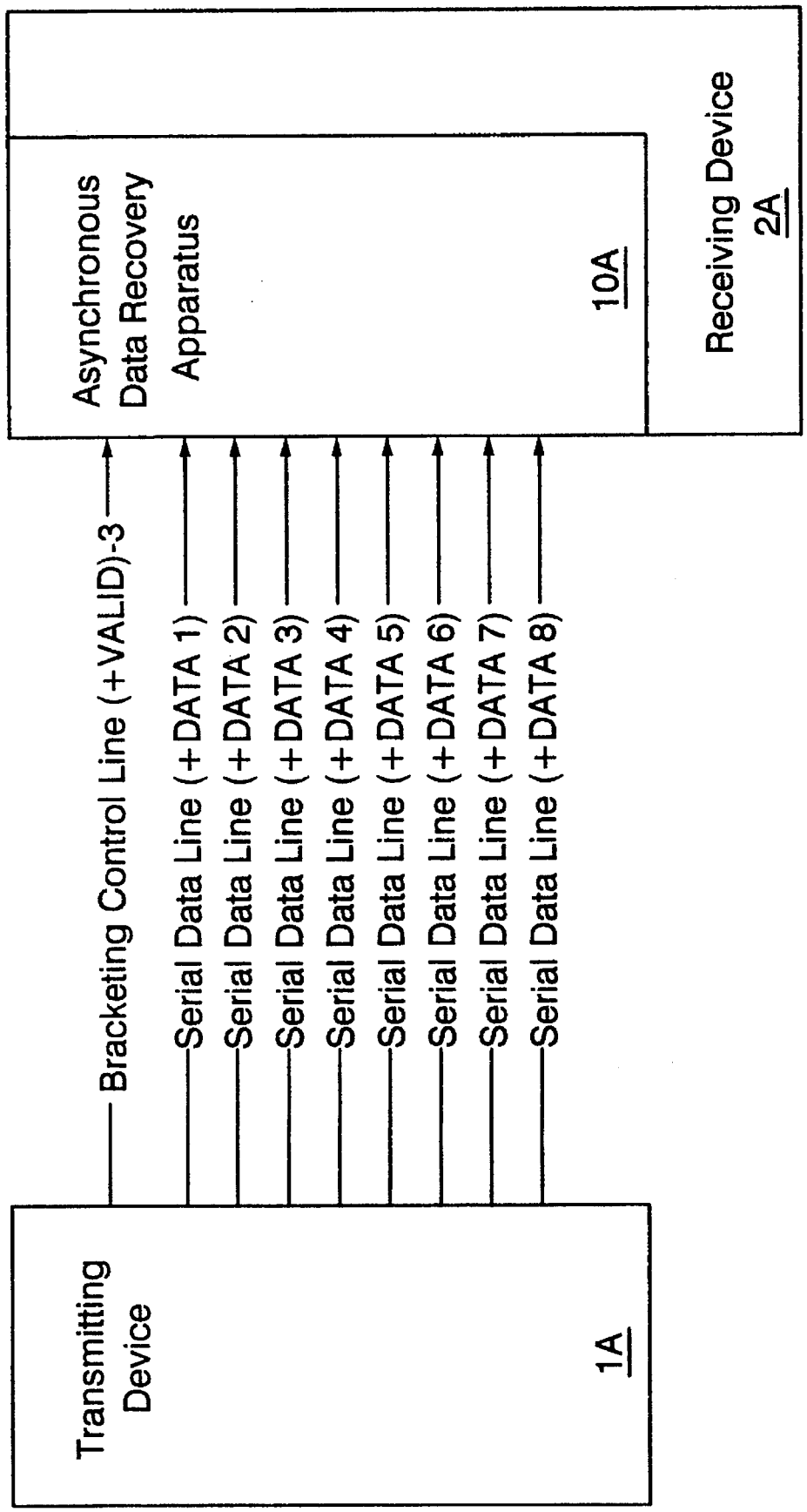

Referring to FIG. 9A, the present invention can be used to recover data from a plurality of serial data lines trader the control of a single bracketing control line 3 and a single set of synchronization logic as defined by blocks 12 and 14 of FIG. 1. In this case, the plurality of serial data lines (+DATA 1 to 8) are transferred in synchronization with each other and at the same frequency—still not in synchronization with receiving device 2A. Referring to FIG. 9, the timing diagram shows that each of the serial data lines (+DATA 1 to 8) contains its own sync bit, but the one +VALID line can be shared among the plurality of serial data lines as shown by the AND gate 90 in FIG. 4, where the dashed line from gate 90 shows that gate 90 replaces the +DATA signal when a plurality of serial lines exist. Referring to FIG. 9B, an overall diagram of the recovery logic for a plurality of serial data lines illustrates how one set of synchronization logic denoted by blocks 12 and 14 is shared among the plurality of serial data lines. Note, however, that each of the plurality of serial data lines requires a unique data alignment circuit 16A to H and a unique input data shift register circuit 18A to H to uniquely align and store the individual serial data bits transmitted by each of the plurality of serial data lines.

Figure 11:
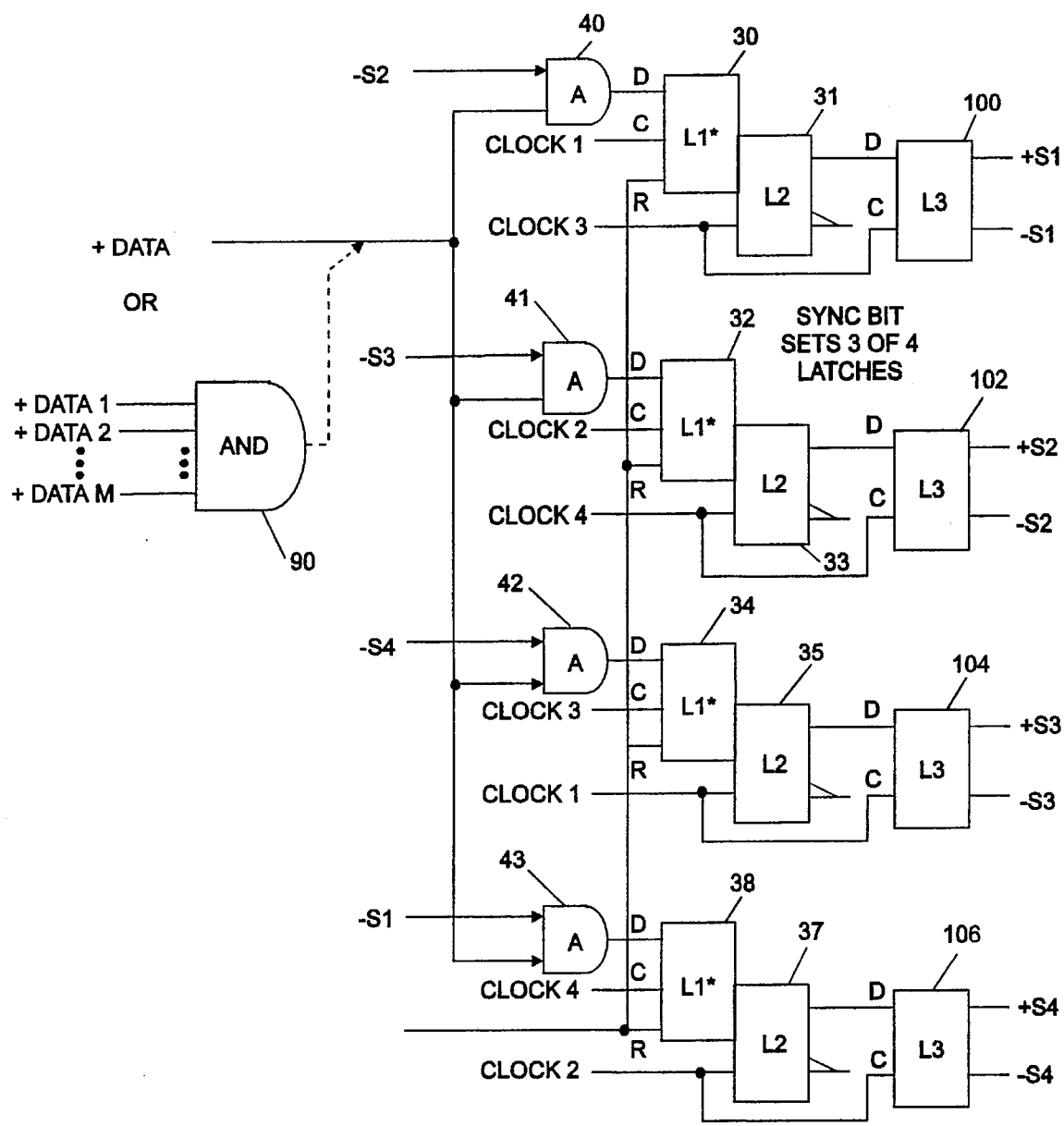
FIG. 11 shows a simple implementation of the two synchronization bit concept including the additional metastability reduction latches.

Referring to FIGS. 10 and 11, to further avoid metastability the sync bit can be extended for an additional clock time, and the one of N-Clock selection extended over 2 clock times. This would allow each double latch (30 to 37) to be extended by a third latch (100, 102, 104 and 106 as shown in FIG. 11) clocked with the same clock as the second latch, only one cycle later. This would allow an extra clock cycle to occur between the rise of the sync bit and the establishment of the +S1 to S4 signals; thus giving any metastability conditions one additional clock time to settle out. The remainder of the recovery circuitry required would operate in the same manner as described for the preferred embodiment where the sync bit is 1 clock wide.

Figure 12:
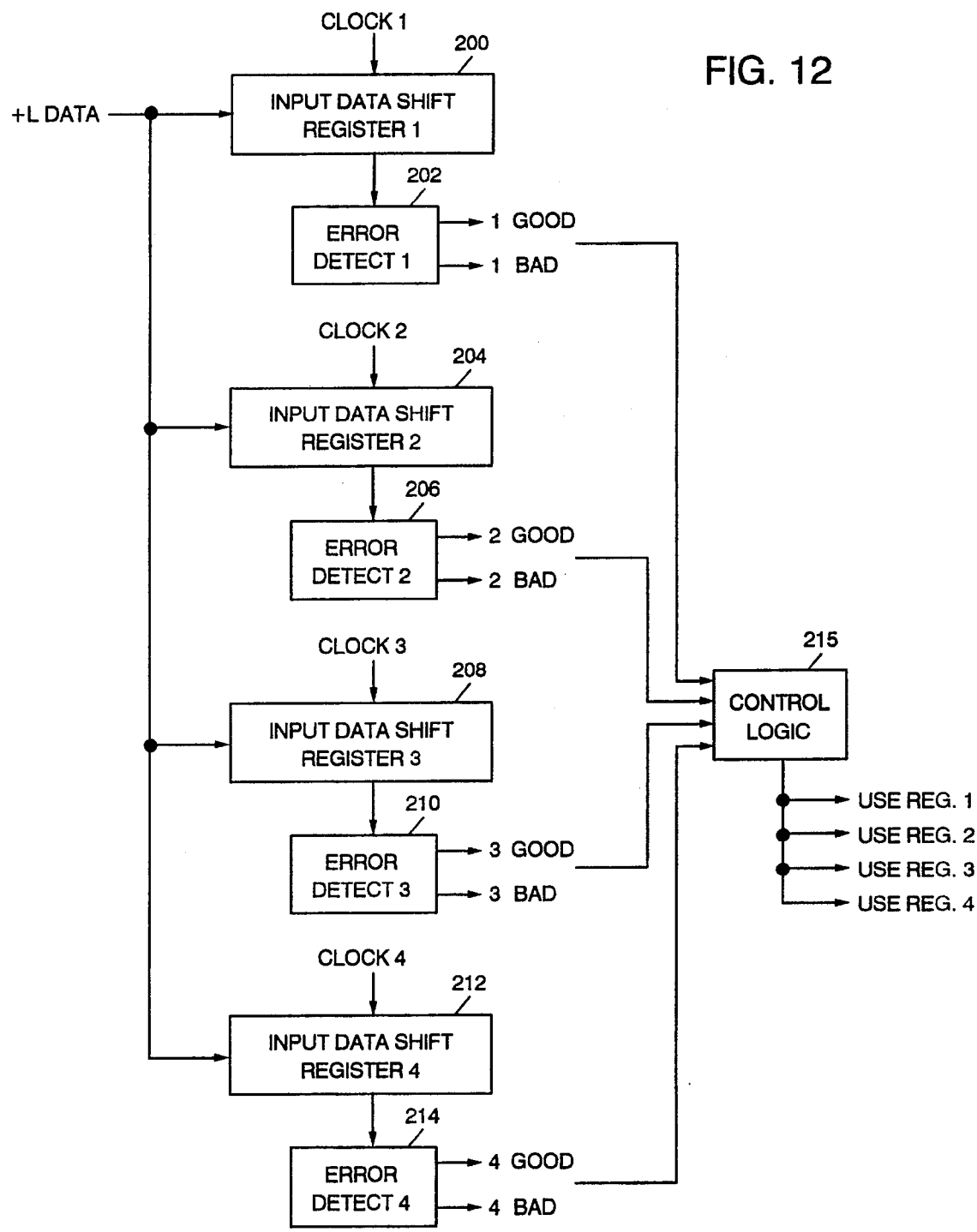
FIG. 12 shows a simple implementation of the other embodiment approach of receiving and checking each data message in redundant hardware, each clocked by a different one of the N phase clocks.

Referring to FIG. 12, to eliminate metastability occurrences completely at the expense of additional hardware, the clock selection circuitry 14 could be eliminated and replaced by 3 more sets of logic consisting of circuits 18, and 19 thus implementing a total of 4 input data shift registers 200, 204, 208 and 212) plus four error detection blocks (202, 206, 210 and 214). This would permit incoming data to be recovered by four identical sets of logic, with each being clocked by a different phase clock as generated by circuit 12. Error detection could be performed on the 4 candidate messages by the four sets of of error detection circuits (202, 206, 210, 214) and control block 215 in that event would select for use on of the sets of data stored in any of the registers (200, 204, 208, 212) that passes the error detection checks correctly.

In the preferred and alternative embodiments the preferred single bit synchronization method provides individual alignment for each message and can respond instantaneously to back-to-back messages from different sources. Synchronization is accomplished in the receiving device by implementing a clocking system capable of generating N phase-shifted clocks all operating at the same frequency as the serial data. Thus the method would determine the bit clock in a data receiver from a first bit sequence of bits received from a data transmitter, by generating a local clock signal, and by generating a plurality of N phase shifted local clock signals of equal frequency from the local clock signal. The N phase shifted clocks are shifted in approximately equal amounts in relationship to each other, and then the synchronization apparatus looks at serial data and determines which of the N phase shifted clocks is best in synchronization with the serial data, and causes apparatus synchronization with individual clock alignment to each message provided by the serial data. The phase shifted local signals vary in time because of generation phase differences, even though all operate at the same frequency. The N clocks are shifted preferably an approximately equal amount in relation to each other. However, by determining which one of N clocks is best in synchronization with the serial data, a decision is made as to which clock selection is to be made, and this is done for every message uniquely. The selection is made entirely during a time when the single synchronization bit, preferably a logical 1, is arriving at the receiving device. The synchronization bit is sampled and one of the N clock times selected which is best in synchronization with the serial data and that clock time is used uniquely to receive the following message. The original clock is preferably a single clock phase shifted so that each clock time compared for selection is shifted an approximately equal amount in relation to each other. The purpose of the invention apparatus is to select the one of N clocks which is best in synchronization with the serial data and then to receive the message correctly.

While we have disclosed these inventions by way of illustration of the preferred embodiment, the accompanying claims should be understood to encompass all the breadth that can be lawfully construed, protecting the inventors rights to the fullest extent possible in light of existing prior work of others. Those skilled in the art upon reading this disclosure, both now and in the future, will undoubtedly conceive of further adaptations and improvements, even by way of invention, which fall within the intended scope of the claims.

What is claimed is:

1. An apparatus for receiving a data message input to the apparatus parallel data inputs having a synchronization bit and a message portion, the apparatus comprising:

receiving means for receiving the data message;

a clock generator for generating a plurality of phase shifted clocks;

a clock selector coupled to said receiving means and to said clock generator for receiving the synchronization bit and the plurality of clocks, and for selecting and outputting one of the plurality of clocks as a selected clock;

a data alignment circuit coupled to both the clock selector and to the receiving means for receiving the message portion and the selected clock, for aligning the message portion with the selected clock directly and unbuffered as it arrives to the apparatus, and for sending the message portion;

a synchronization means for generating the selected clock from the parallel data inputs and synchronization bit, stripping the synchronization bit from the data message, and activating the selected clock to data alignment circuit within one clock time of the input of the synchronization bit to the receiving means; and an input circuit coupled to the data alignment circuit for receiving and storing the message portion, and for sending the message portion to an attached receiving device.

2. The apparatus of claim 1 further comprising an error detector coupled to the input circuit for performing error detection upon the message portion stored in the input circuit.

3. The apparatus of claim 1, wherein said clock selector further includes a plurality of gates for selecting one clock from the plurality of phase shifted clocks for outputting as the selected clock, the clock selection being determined by the pattern in the plurality of latches, the selected clock being aligned with the parallel data inputs, the data inputs being clocked into latches directly by the selected clock and the selected clock providing a continuous clock for the duration of the data message.

4. The apparatus of claim 1 wherein the receiving means includes a plurality of incoming data lines each for transmitting a separate portion of the data message.

5. The apparatus of claim 1, wherein said clock selector includes a plurality of latch circuits, each latch circuit being clocked by one of said plurality of phase shifted clocks, and said synchronization means establishing and holding for the duration of said data message a pattern in said plurality of latch circuits including some latches setting and some latches not setting.

6. The apparatus of claim 5, wherein the synchronization means for establishing said pattern of set and unset latches includes a first latch circuit which is set by the rise of the first phase shifted clock subsequent to said synchronization bit, a second latch circuit which is set by the rise of the second phase shifted clock subsequent to said synchronization bit, a third latch circuit which is set by the rise of the third phase shifted clock subsequent to said synchronization bit, and further latch circuits which are inhibited from setting after three latches are set.

7. An apparatus for receiving a data message having a synchronization bit and a message portion, the apparatus comprising:

receiving means for receiving the data message;

a clock generator for generating a plurality of phase shifted clocks;

a clock selector coupled to said receiving means and to said clock generator for receiving the synchronization bit and the plurality of clocks, and for selecting and outputting one of the plurality of clocks;

data alignment circuit coupled to both the clock selector and to the receiving means for receiving the message portion and a selected clock, for aligning the message portion with the selected clock, and for sending the message portion, wherein said data alignment circuit includes a plurality of delay latches each for buffering each bit of the message portion, a first one of the delay latches clocked by the selected clock and a second one of the delay latches clocked by an inverse of the selected clock; and an input circuit coupled to the data alignment circuit for receiving and storing the message portion, and for sending the message portion to an attached receiving device.

8. The apparatus of claim 7 wherein said delay latches each include an output selectable by the input circuit for receiving the message portion.

9. The apparatus of claim 8 wherein the input circuit is coupled to a subset of said plurality of latches and selects a delay latch for receiving the message portion in response to signals from said subset of said plurality of latches.

10. An apparatus for receiving a data message having a synchronization bit and a message portion, the apparatus comprising:

receiving means for receiving the data message wherein the receiving means includes a plurality of incoming data lines, one of the incoming data lines for transmitting control signals to the apparatus, the control signals including;

a reset signal for resetting the apparatus after an end of the data message in order to receive another data message or during a pause in a transmission of the message portion to resynchronize the apparatus;

a starting signal for indicating to the apparatus when a data message transmission is starting;

a clock generator for generating a plurality of phase shifted clocks;

a clock selector coupled to said receiving means and to said clock generator for receiving the synchronization bit and the plurality of clocks, and for selecting and outputting one of the plurality of clocks;

a data alignment circuit coupled to both the clock selector and to the receiving means for receiving the message portion and a selected clock, for aligning the message portion with the selected clock and for sending the message portion; and an input circuit coupled to the data alignment circuit for receiving and storing the message portion, and for sending the message portion to an attached receiving device.

11. The apparatus of claim 10 wherein the plurality of incoming data lines each for transmitting a separate segment of the data message, and wherein the apparatus further comprises:

a plurality of additional ones of said data alignment circuit each coupled to one of the incoming data lines for receiving a segment of the message portion and each coupled to the clock selector for receiving the selected clock; and a plurality of additional ones of said input circuit each coupled to one of the plurality of additional ones of said data alignment circuit for receiving and storing the segment of the message portion, and for sending the segment of the message portion to the attached receiving device.

12. The apparatus of claim 11 wherein the incoming data lines each transmit the synchronization bit prefixed to each said separate segment of the data message and wherein the incoming data lines are all coupled to an AND gate whose output provides the synchronization bit to the clock selector.

13. An apparatus for receiving a data message having a synchronization bit and a message portion, the apparatus comprising:

receiving means for receiving the data message, the receiving means including a plurality of incoming data lines each for transmitting a separate portion of the data message, wherein the incoming data lines each transmit the synchronization bit prefixed to each data message and wherein the incoming data lines are all coupled to an AND gate whose output provides the synchronization bit to the clock selector;

a clock generator for generating a plurality of phase shifted clocks;

a clock selector coupled to said receiving means and to said clock generator for receiving the synchronization bit and the plurality of clocks, and for selecting and outputting one of the plurality of clocks;

a data alignment circuit coupled to both the clock selector and to the receiving means for receiving the message portion and a selected clock, for aligning the message portion with the selected clock, and for sending the message portion; and an input circuit coupled to the data alignment circuit for receiving and storing the message portion, and for sending the message portion to an attached receiving device.

* * * * *